(12) United States Patent
Kuroda et al.

(10) Patent No.: US 10,591,942 B2
(45) Date of Patent: Mar. 17, 2020

(54) VOLTAGE REGULATOR AND METHOD OF CONTROLLING VOLTAGE REGULATOR

(71) Applicant: ABLIC Inc., Chiba-shi, Chiba (JP)

(72) Inventors: Tadakatsu Kuroda, Chiba (JP);
Tsutomu Tomioka, Chiba (JP);
Hideyuki Sawai, Chiba (JP);
Michiyasu Deguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/506,733

(22) Filed: Jul. 9, 2019

(65) Prior Publication Data
US 2020/0019200 A1 Jan. 16, 2020

(30) Foreign Application Priority Data
Jul. 13, 2018 (JP) .................................. 2018-133194

(51) Int. Cl.
*G05F 1/575* (2006.01)
*H03F 3/45* (2006.01)

(52) U.S. Cl.
CPC ......... *G05F 1/575* (2013.01); *H03F 3/45269* (2013.01)

(58) Field of Classification Search
CPC . G05F 1/462; G05F 1/56; G05F 1/575; G05F 1/562; G05F 1/573; G05F 1/5735; G05F 1/46; G05F 1/461; G05F 1/561; G05F 1/569; G05F 1/571

USPC ........................... 323/273–281; 327/538–543
See application file for complete search history.

(56) References Cited

U.S. PATENT DOCUMENTS

| 7,429,852 B2 * | 9/2008 | Takagi | G05F 1/575 323/275 |
| 2010/0079121 A1 * | 4/2010 | Yanagawa | G05F 1/573 323/277 |
| 2015/0002231 A1 * | 1/2015 | Huang | H03F 1/301 330/296 |
| 2015/0205315 A1 | 7/2015 | Tomioka | |

FOREIGN PATENT DOCUMENTS

JP 2015-138394 A 7/2015

* cited by examiner

*Primary Examiner* — Nguyen Tran
(74) *Attorney, Agent, or Firm* — Brinks Gilson & Lione

(57) ABSTRACT

A voltage regulator which includes a differential amplifier circuit containing a first and second input transistors, controlling a gate-source voltage in each of the first and second input transistors including: a current source configured to drive the differential amplifier circuit; the first input transistor containing a gate; the second input transistor containing a gate; and a voltage controller including at least one of a first voltage control circuit to control a voltage at a tail connection point, a second voltage control circuit to control the voltage at the gate of the first input transistor, a third voltage control circuit to control the voltage at the tail connection point, and a fourth voltage control circuit to control the voltage at the gate of the second input transistor.

20 Claims, 6 Drawing Sheets

VOLTAGE REGULATOR AND METHOD OF CONTROLLING VOLTAGE REGULATOR

RELATED APPLICATIONS

Priority is claimed on Japanese Patent Application No. 2018-133194, filed on Jul. 13, 2018, the content of which is incorporated herein by reference.

BACKGROUND OF THE INVENTION

1. Field of the Invention

The present invention relates to a voltage regulator and a method of controlling a voltage regulator.

2. Description of the Related Art

A voltage regulator stably supplies a constant voltage from an output terminal thereof even if an output current thereof is changed by a load change or the like.

However, if a significant load change occurs to cause an excessive overshoot voltage at the output terminal, or if a short-circuit is caused by connection between the output terminal and a power source terminal (hereinafter sometimes referred to as "a power supply short-circuit"), the gate voltage of an input transistor in a differential amplifier circuit of the voltage regulator connected to the output terminal rises. In view of preventing the gate of the input transistor from breaking down, the voltage regulator may include a circuit configuration in which, even if an overshoot occurs at the output terminal or a short-circuit is caused by connection with the power source terminal, an excessive rise in the gate voltage of the input transistor is inhibited to prevent the gate of the input transistor from breaking down (see, for example, Japanese Patent Application Laid-open No. 2015-138394).

FIG. 9 is a circuit diagram illustrating a configuration example of a conventional voltage regulator described in Japanese Patent Application Laid-open No. 2015-138394. With referring to FIG. 9, a diode 121 is connected between a gate and a source of a PMOS transistor as a first input transistor 111 in a differential amplifier circuit. If an overshoot occurs at an output terminal 120, the arrangement of the diode 121 allows an electric current to flow from the output terminal 120 to the ground of a voltage regulator through a resistor 116, the diode 121, a second input transistor 109, and an NMOS transistor 108. Thus, the gate voltage of the first input transistor 111 can be reduced until a voltage difference between the gate voltage and a voltage at a connection point P1 corresponds to a forward voltage of the diode 121.

In the conventional voltage regulator, it is possible to inhibit the gate of the first input transistor 111 from breaking down due to an overshoot at the output terminal 120.

However, in the conventional voltage regulator, if the voltage at the output terminal 120 drops due to a short-circuit caused by connection with the ground terminal GND (hereinafter sometimes referred to as "a ground short-circuit", bias temperature instability (BTI) differently affects the first input transistor 111 and the second input transistor 109 in a differential amplifier circuit 151, thus causing an offset in an output voltage from the output terminal 120.

In the following, with reference to FIG. 9, description is given of the offset caused in the output voltage if the voltage at the output terminal 120 drops. A reference voltage VREF is applied from a constant voltage source 110 and is applied to the gate of the second input transistor 109.

If the voltage at the output terminal 120 drops, a gate voltage VFB of the first input transistor in the differential amplifier circuit drops to a level in the vicinity of that of a ground voltage.

Consequently, the gate voltage of the input first transistor 111 drops to a level significantly smaller than that of the reference voltage VREF applied to the gate of the second input transistor 109, and substantially the entire drain current (tail current) flows from the PMOS transistor 105 into the first input transistor 111.

The respective gate-source voltages of the first and second input transistors 111 and 109 in the case described above are represented by Vgs(111) and Vgs(109) given below.

$$Vgs(111) \approx Vth(111)$$

$$Vgs(109) = VREF - |Vgs(111)|$$

In consideration of the respective gate-source voltages Vgs(111) and Vgs(109), the second input transistor 109 is affected by positive bias temperature instability (PBTI).

The first transistor 111 is affected by negative bias temperature instability (NBTI).

If the voltage drop at the output terminal 120 continues over a long period of time, an amount of variation in threshold voltage of the second input transistor 109 under the influence of the PBTI is different from an amount of variation in threshold voltage of the first input transistor 111 under the influence of the NBTI. In the first input transistor 111, the gate-source voltage Vgs(111) applied to the gate is approximate to the threshold voltage, and the threshold voltage variation is accordingly less affected by the NBTI.

Thus, while the respective threshold voltages of input transistors 111 and 109 are the same during manufacturing, the respective amounts of variation in threshold voltage described above are different. Consequently, the input transistors 111 and 109 have different threshold voltages.

In the differential amplifier circuit, due to imbalance between the threshold voltages, differential amplification of the reference voltage VREF and an output voltage VOUT is normally performed. In accordance with the voltage difference between the threshold voltages, an offset occurs in the output voltage, resulting in that the output voltage corresponding to the reference voltage cannot be obtained.

SUMMARY OF THE INVENTION

The present invention has been made in view of such circumstances. It is an object of the present invention to provide a voltage regulator and a method of controlling a voltage regulator, the voltage regulator being capable of reducing the difference between amounts of variation in threshold voltage of respective input transistors in a differential amplifier circuit of the voltage regulator if a voltage at an output terminal of the voltage regulator drops as a result of a short-circuit by grounding or other such factor, and inhibiting an offset from occurring in an output voltage.

According to at least one embodiment of the present invention, there is provided a voltage regulator which includes a differential amplifier circuit containing a first input transistor and a second input transistor and is configured to control a gate-source voltage in each of the first input transistor and the second input transistor respectively being a PMOS transistor including: a current source containing a current source output port, being configured to drive the differential amplifier circuit; the first input transistor containing a source connected to the current source output port via a tail connection point and a gate to which a reference voltage is supplied; the second input transistor containing a source connected to the tail connection point and a gate connected to the output terminal; and a voltage controller including at least one of a first voltage control circuit which is interposed between the tail connection point and the gate of the first input transistor and is configured to control a voltage at the tail connection point based on a voltage at the gate of the first input transistor, a second voltage control circuit which contains a first port connected to the gate of the first input transistor, a second port connected to a grounding point, and a third port connected to the gate of the second input transistor and is configured to control the voltage at the gate of the first input transistor based on a voltage at the gate of the second input transistor, a third voltage control circuit which is interposed between the tail connection point and the gate of the second input transistor and is configured to control the voltage at the tail connection point based on the voltage at the gate of the second input transistor, and a fourth voltage control circuit which contains a first port connected to the gate of the second input transistor, a second port connected to the grounding point, and a third port connected to the gate of the first input transistor and is configured to control the voltage at the gate of the second input transistor based on the voltage at the gate of the first input transistor.

According to at least one embodiment of the present invention, there is provided a method of controlling a voltage regulator which includes a current source configured to drive a differential amplifier circuit, a first input transistor, and a second input transistor, the first input transistor being a PMOS transistor containing a source connected to a current source output terminal of the current source via a tail connection point and containing a gate to which a reference voltage is input, the second input transistor being a PMOS transistor containing a source connected to the tail connection point and containing a gate connected to an output terminal, the voltage regulator being configured to control, if a short circuit occurs between the output terminal configured to output a predetermined output voltage and a ground, a gate-source voltage of each of the first transistor and the second input transistor in the differential amplifier circuit configured to control the predetermined output voltage the method including: preparing a voltage controller including at least one of a first voltage control circuit which is interposed between the tail connection point and the gate of the first input transistor and is configured to control a voltage at the tail connection point based on a voltage at the gate of the first input transistor, a second voltage control circuit which contains a first port connected to the gate of the first input transistor, a second port connected to a grounding point, and a third port connected to the gate of the second input transistor and is configured to control the voltage at the gate of the first input transistor based on a voltage at the gate of the second input transistor, a third voltage control circuit which is interposed between the tail connection point and the gate of the second input transistor and is configured to control the voltage at the tail connection point based on the voltage at the gate of the second input transistor, and a fourth voltage control circuit which contains a first port connected to the gate of the second input transistor, a second port connected to the grounding point, and a third port connected to the gate of the first input transistor and is configured to control the voltage at the gate of the second input transistor based on the voltage at the gate of the first input transistor; and performing a voltage controller by the voltage controller, the voltage control including at least one of controlling a voltage at the tail connection point based on a voltage at the gate first input transistor, controlling the voltage at the gate of the first input transistor based on a voltage at the gate of the second input transistor, controlling the voltage at the tail connection point based on the voltage at the gate of the second input transistor, and controlling the voltage at the gate of the second input transistor based on a voltage at the gate of the second input transistor.

According to the present invention, it is possible to provide the voltage regulator and the method of controlling a voltage regulator, the voltage regulator being capable of reducing the difference between amounts of variation in threshold voltage of respective input transistors in the differential amplifier circuit of the voltage regulator if the voltage at the output terminal drops as a result of the short-circuit caused by grounding or other such factor, and inhibiting an offset from occurring in the output voltage.

DETAILED DESCRIPTION OF THE PREFERRED EMBODIMENTS

First Embodiment

Figure 1:
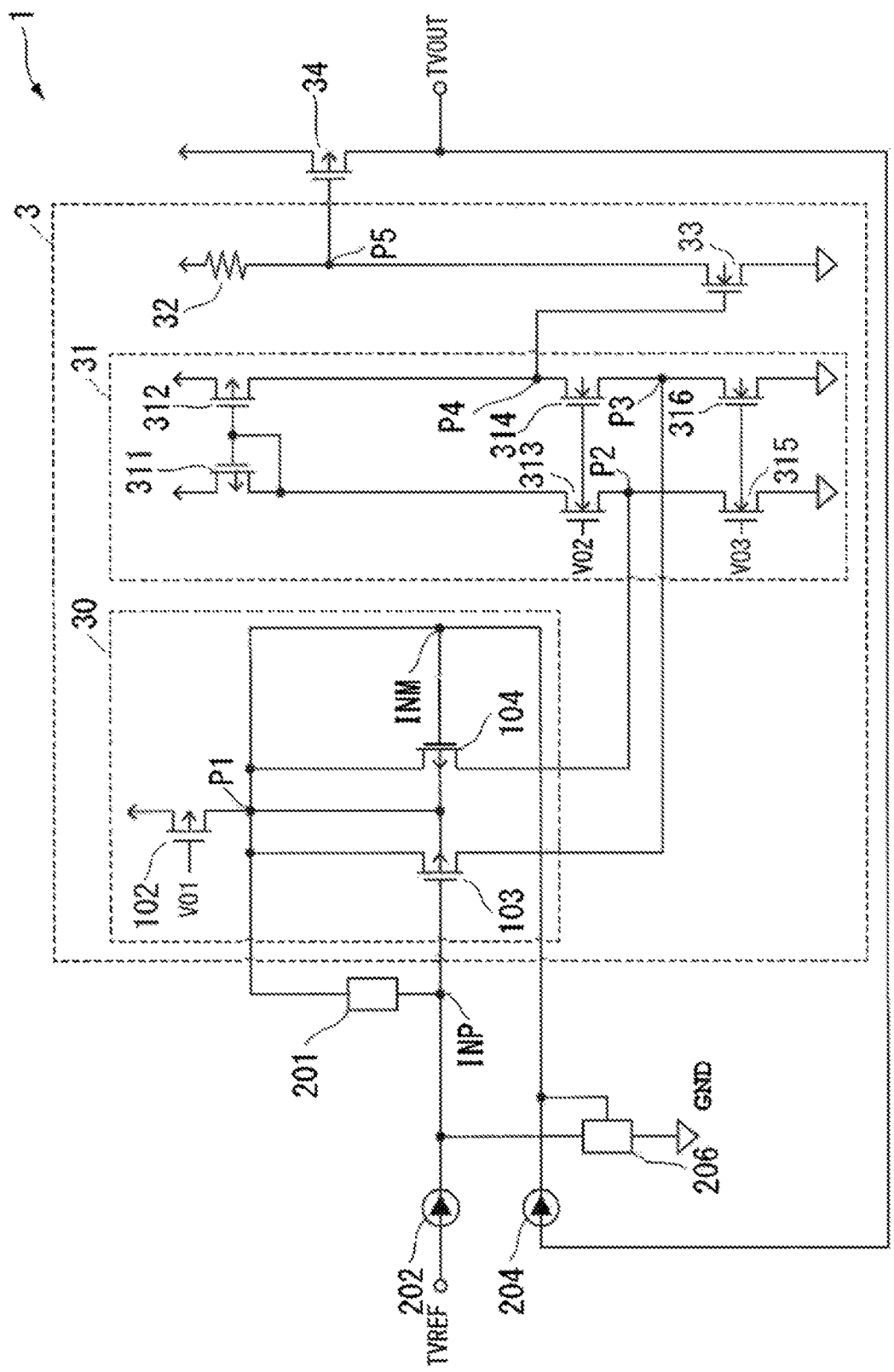
FIG. 1 is a circuit diagram for illustrating a configuration example of a voltage regulator according to a first embodiment of the present invention.

In the following, description is given of a first embodiment of the present invention with reference to the drawings. FIG. 1 is a circuit diagram for illustrating a configuration example of a voltage regulator 1 according to the first embodiment.

The voltage regulator 1 includes a differential amplifier circuit 3, a PMOS transistor 34, an input transistor gate-source voltage limiting circuit (hereinafter, referred to as "GS voltage limiting circuit") 201 and an input differential pair gate-gate voltage limiting circuit (hereinafter, referred to as "GG voltage limiting circuit") 206 which serve as a voltage controller including at least one voltage control circuit, and input current limiting circuits 202 and 204.

The GS voltage limiting circuit 201 serving as a first voltage control circuit is interposed between a tail connection point P1 and a gate of a PMOS transistor 103. The GS voltage limiting circuit 201 controls, if a short circuit occurs between an output terminal TVOUT and the ground, a voltage difference between the tail connection point P1 and the gate of the PMOS transistor 103 to a level equal to or lower than that of a predetermined voltage (absolute value).

The GG voltage limiting circuit 206 serving as a second voltage control circuit is interposed between the gate of the PMOS transistor 103 and a grounding point. The GG voltage limiting circuit 206 controls, if a short-circuit occurs between the output terminal TVOUT and the ground, a voltage VINP at a connection point INP such that a voltage difference between the gate of the PMOS transistor 103 and a gate of a PMOS transistor 104 is equal to or lower than a predetermined voltage. Each of the PMOS transistors 103 and 104 is an input transistor in the differential amplifier circuit 3.

The differential amplifier circuit 3 includes a differential input circuit 30, a current mirror circuit 31, a resistor 32, and an NMOS transistor 33.

The differential input circuit 30 includes the PMOS transistor 102 serving as a current source, the PMOS transistor 103 serving as a first input transistor, and the PMOS transistor 104 serving as a second to input transistor.

The current mirror circuit 31 is a cascode-connected current mirror circuit, and includes PMOS transistors 311 and 312 and NMOS transistors 313, 314, 315, and 316.

The PMOS transistor 102 forms a current source, a contains a source connected to a power source, a gate to which a bias voltage V01 is applied, and a drain which serves as a current source output port and is connected to the tail connection point P1.

The PMOS transistor 104 contains a source and a back gate each connected to the tail connection point P1, while containing a gate connected at a connection point INM to an output terminal of the input current limiting circuit 204.

The PMOS transistor 103 contains a source and a back gate each connected to the tail connection point P1, while containing a gate connected at a connection point INP to an output terminal of the input current limiting circuit 202.

The input current limiting circuit 202 includes an input terminal connected to a terminal TVREF and to which a reference voltage VREF is supplied.

The input current limiting circuit 204 includes an input terminal connected to the output terminal TVOUT and to which an output voltage VOUT is supplied.

In the current mirror circuit 31, a connection point P2 between a source of the NMOS transistor 313 and a drain of the NMOS transistor 315 is connected to a drain of the PMOS transistor 104.

Similarly, a connection point P3 between a source of the NMOS transistor 314 and a drain of the NMOS transistor 316 is connected to a drain of the PMOS transistor 103.

To respective gates of the NMOS transistors 313 and 314, a bias voltage V02 is applied while, to respective gates of the NMOS transistors 315 and 316, a bias voltage V03 is applied.

In the above configuration, to the respective connection points P2 and P3, differential currents are supplied from the PMOS transistors 103 and 104. Based on the differential currents, a differential voltage at a connection point P4 between a drain of the PMOS transistor 312 and a drain of the NMOS transistor 314 is controlled. The differential voltage at the connection point P4 is supplied to a gate of the NMOS transistor 33, and an amplified voltage is generated at a connection point P5 between the resistor 32 and a drain of the NMOS transistor 33. The amplified voltage is supplied from the connection point P5 to a gate of the PMOS transistor 34 to allow the output voltage VOUT corresponding to the amplified voltage to be output from the output terminal TVOUT.

Figure 2A:
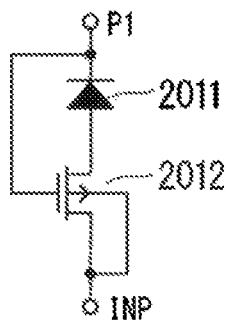
FIG. 2A and FIG. 2B are circuit diagrams for illustrating examples of a GS voltage limiting circuit.
Figure 2B:
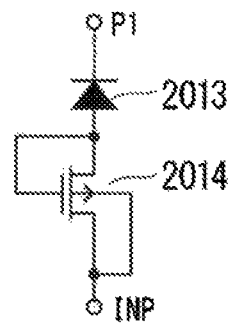

FIG. 2A and FIG. 2B are circuit diagrams for illustrating examples of the GS voltage limiting circuit 201.

In the example in FIG. 2A, the GS voltage limiting circuit 201 includes a diode 2011 and a PMOS transistor 2012. The diode 2011 contains a cathode connected to the tail connection point P1 in FIG. 1. The PMOS transistor 2012 contains a drain connected to an anode of the diode 2011 and contains a gate connected to the tail connection point P1, wile containing a source and a back gate each connected to the connection point INP.

In the example in FIG. 2B, the GS voltage limiting circuit 201 includes a diode 2013 and a PMOS transistor 2014. The diode 2013 contains a cathode connected to the tail connection point P1 in FIG. 1. The PMOS transistor 2014 contains a drain and a gate each connected to an anode of the diode 2013, while containing a source and a back gate each connected to the connection point INP.

Figure 3:
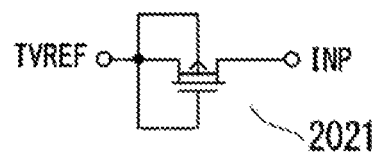
FIG. 3 is a circuit diagram for illustrating an example of each of input current limiting circuits.

FIG. 3 is a circuit diagram for illustrating an example of each of the input current limiting circuits 202 and 204. Since the input current limiting circuits 202 and 204 include the same configuration, the each configuration is described through use of the input current limiting circuit 202.

The input current limiting circuit 202 includes a depletion-type PMOS transistor 2021. The PMOS transistor 2021 contains a source, a gate, and a back gate each connected to the terminal TVREF (TVOUT), while containing a drain connected to the connection point INP (INM). The reference symbols TVOUT and INP in the above parentheses represent connection objects in the case of the input current limiting circuit 204. That is, the depletion-type PMOS transistor in the input current limiting circuit 204 contains the source, the gate, and the back gate each connected to the terminal TVOUT, while containing the drain connected to the connection point INM.

Figure 4A:
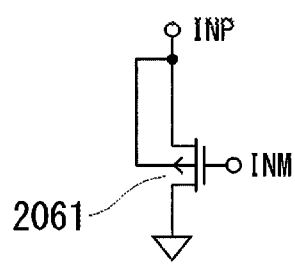
FIG. 4A and FIG. 4B are circuit diagrams for illustrating examples of a GG voltage limiting circuit.
Figure 4B:
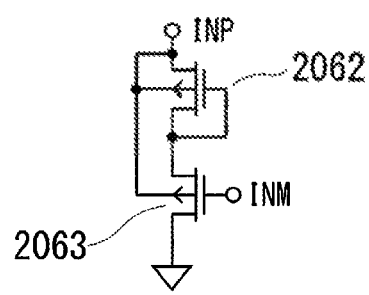

FIG. 4A and FIG. 4B are circuit diagrams for illustrating examples of the GG voltage limiting circuit 206.

In the example in FIG. 4A, the GG voltage limiting circuit 206 includes a PMOS transistor 2061. The PMOS transistor 2061 contains a source and a back gate each connected to the connection point INP in FIG. 1, while containing a gate connected to the connection point INM and containing a drain connected to the grounding point.

In the example in FIG. 4B, the GG voltage limiting circuit 206 includes PMOS transistors 2062 and 2063. The PMOS transistors 2062 and 2063 are formed to have the same threshold voltage Vth. The PMOS transistor 2062 contains a source and a back gate each connected to the connection point INP in FIG. 1, while containing a gate and a drain each connected to a source of the PMOS transistor 2063. The PMOS transistor 2063 contains a gate connected to the connection point INM in FIG. 1 and contains a drain connected to the grounding point.

In the following, description is given of the operation of each of the GS voltage limiting circuit 201 and the GG voltage limiting circuit 206 in a state in which the output terminal TVOUT is short-circuited by grounding, and consequently a voltage (output voltage VOUT) at the output terminal TVOUT is reduced to a level in the vicinity of that of a ground voltage. The description is given through use of the circuit of FIG. 2A as the GS voltage limiting circuit 201 and through use of the circuit of FIG. 4B as the GG voltage limiting circuit 206.

As a result of the short-circuiting of the output terminal TVOUT with the ground, the voltage reduction at the output terminal TVOUT results in a reduction of a voltage VINM at the connection point INM.

Consequently, the voltage applied to the gate of the PMOS transistor 104 is also reduced.

Meanwhile, the GG voltage limiting circuit 206 clamps the voltage VINP at the connection point INP to a value corresponding to the total of the respective threshold voltages Vth of the PMOS transistors 2062 and 2063.

In other words, the voltage VINP at the connection point INP is clamped by the GG voltage limiting circuit 206 to a voltage given by VOUT+2×Vth.

In the GG voltage limiting circuit 206, a clamp current for clamping the voltage at the connection point INP flows, but the input current limiting circuit 202 limits the clamp current to a predetermined current value.

As a result of the reduction of the voltage VINM at the connection point INM, a voltage applied to the gate of the PMOS transistor 104 is at a level in the vicinity of that of the ground voltage, and consequently a current flows in the PMOS transistor 104.

Consequently, a voltage at the tail connection point P1 is reduced, but the GS voltage limiting circuit 201 clamps the voltage at the tail connection point P1 to a predetermined voltage.

In other words, if the voltage at the tail connection point P1 becomes lower than the voltage VINP at the connection point INP, the PMOS transistor 2012 turns into an ON state, a clamp current flows from the connection point INP to the tail connection point P1, and the voltage at the tail connection point P1 is clamped to a level obtained by subtracting the threshold voltage Vth(2012) from the voltage VINP.

In the following, description is given of a gate-source voltage Vgs(103) applied to the gate of the PMOS transistor 103 and a gate-source voltage Vgs(104) applied to the gate of the PMOS transistor 104, each based on the output voltage VOUT. Here the gate-source voltage Vgs(103) is the clamped voltage at the tail connection point P1 and the gate-source voltage Vgs(104) is the clamped voltage at the connection point INP, respectively described above.

The PMOS transistors 103 and 104 and the PMOS transistors 2012, 2062, and 2063 are formed to have the same threshold voltage Thus, the threshold voltage thereof is simply represented as Vth.

The gate-source voltage Vgs(103) of the PMOS transistor 103 is obtained by subtracting the voltage at the tail connection point P1 from the voltage VINP at the connection point INP.

$$Vgs(103)=(VOUT+2\times Vth)-(VOUT+2\times Vth-Vth)\\=Vth$$

Similar the gate-source voltage Vgs(104) the PMOS transistor 104 is obtained by subtracting the voltage at the tail connection point P1 from the voltage VINM at the connection point INM.

$$Vgs(104)=(VOUT)-(VOUT+2\times Vth-Vth)=-Vth$$

According to the above-mentioned calculation, the gate-source voltage Vgs(103) of the PMOS transistor 103 is the voltage Vth which gives an influence of PBTI to the PMOS transistor 103. Meanwhile, the gate-source voltage Vgs(104) of the PMOS transistor 104 is a voltage −Vth which gives an influence of NBTI to the PMOS transistor 104.

However, each absolute value of the gate-source voltage Vgs(103) and the gate-source voltage Vgs(104) is controlled to be equal to or smaller than Vth as the voltage value.

Thus, according to the first embodiment, due to the clamping operation by each of the GS voltage limiting circuit 201 and the GG voltage limiting circuit 206, a difference between the gate-source voltage Vgs(103) of the PMOS transistor 103 and the gate-source voltage Vgs(104) of the PMOS transistor 104 resulting from the short-circuiting of the output terminal TVOUT with the ground is reduced as compared to that achieved hitherto.

Thus, according to the first embodiment, imbalance between the respective influences given by the NBTI and the PBTI to the PMOS transistors 103 and 104 is significantly reduced, with the result that it is possible to reduce a difference between the respective amounts of variation in gate-source voltage Vgs(103) applied to the gate of the PMOS transistor 103 and variation in gate-source voltage Vgs(104) applied to the gate of the PMOS transistor 104, and thereby inhibit an offset in the output voltage VOUT.

Second Embodiment

Figure 5:
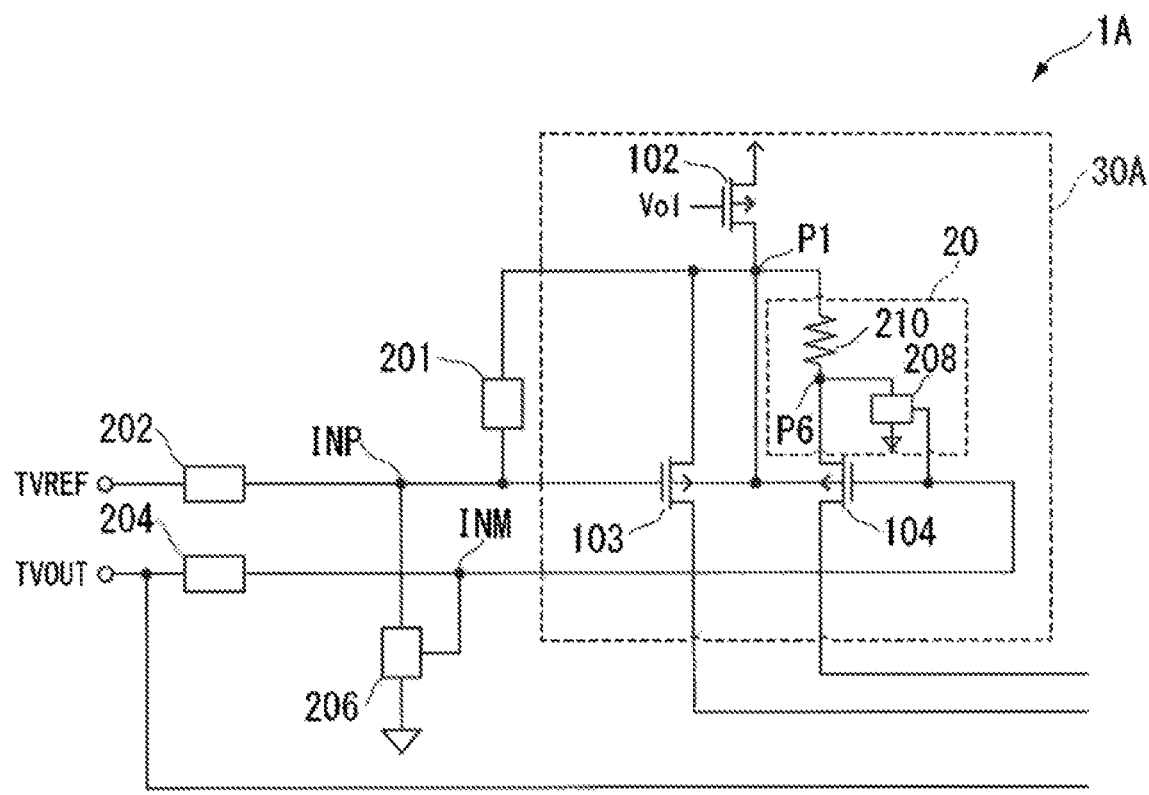
FIG. 5 is a circuit diagram for illustrating a configuration example of a voltage regulator according to a second embodiment of the present invention.

In the following, description is given of a second embodiment of the present invention with reference to the drawings. FIG. 5 is a circuit diagram for illustrating an example of a configuration of a voltage regulator 1A according to the second embodiment of the present invention.

In the circuit FIG. 5, a voltage regulator 1A includes the same configuration as that of the voltage regulator 1, and therefore the respective configurations of the current mirror circuit 31, the resistor 32, the NMOS transistor 33, and the PMOS transistor 34 in FIG. 1 are omitted in FIG. 5. In the following, description is given of a configuration and an operation which are different from those in the first embodiment.

The configuration different from that in the first embodiment is a differential input circuit 30A further including an NBTI reduction circuit 20 in addition to the differential input circuit 30. If a short-circuit occurs between the output terminal TVOUT and the ground, the NBTI reduction circuit 20 sets the absolute value of the gate-source voltage Vgs(104) applied to the gate of the PMOS transistor 104 smaller than that in the first embodiment to reduce the influence of the NBTI on the PMOS transistor 104 as compared to the first embodiment. In other words, if a short-circuit occurs between the output terminal TVOUT and the ground, the difference between gate-source voltage Vgs(103) of the PMOS transistor 103 and the gate-source voltage Vgs(104) of the PMOS transistor 104 is further reduced.

The NBTI reduction circuit 20 includes a resistor 210 and an GS voltage limiting circuit 208 serving as a sixth voltage control circuit. The GS voltage limiting circuit 208 has a function of controlling the gate-source voltage Vgs(104) of the PMOS transistor 104 to a level less than that of the threshold voltage Vth of the PMOS transistor 104.

The resistor 210 is interposed between the tail connection point P1 and the source of the PMOS transistor 104.

The GS voltage limiting circuit 208 is interposed between a connection point P6 between the resistor 210 and the PMOS transistor 104 and the grounding point.

Figure 6A:
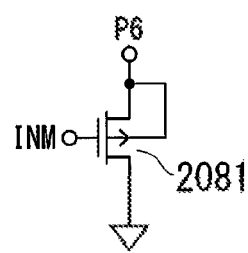
FIG. 6A and FIG. 6B are circuit diagrams for illustrating an examples of a GS voltage limiting circuit.
Figure 6B:
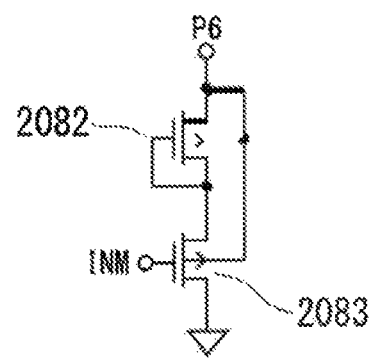

FIG. 6A and FIG. 6B are circuit diagrams for illustrating examples of the GS voltage limiting circuit 208.

In the example in FIG. 6A, the GS voltage limiting circuit 208 includes a PMOS transistor 2081. The PMOS transistor 2081 contains a source and a back gate each connected to the connection point P6 in FIG. 5, while containing a gate connected to the connection point INM and containing a drain connected to the grounding point. Assuming that a threshold voltage Vth(2081) is less than a threshold voltage Vth(104), the PMOS transistor 2081 is formed.

In the example in FIG. 6B, the GS voltage limiting circuit 208 includes PMOS transistors 2082 and 2083. The PMOS transistor 2082 contains a source and a back gate each connected to the connection point P6 in FIG. 5, while containing a gate and a drain each connected to a source of the PMOS transistor 2083. The PMOS transistor 2083 contains a back gate connected to the connection point P6 in FIG. 5, while containing a gate connected to the connection point INM and containing a drain connected to the grounding point. Assuming that a value obtained by adding together a threshold voltage Vth(2082) and a threshold voltage Vth (2083) is less than the threshold voltage Vth(104), each of the PMOS transistors 2082 and 2083 is formed.

In the circuit in FIG. 6A, the GS voltage limiting circuit 208 can reduce the gate-source voltage Vgs(104) applied to the gate of the PMOS transistor 104 from −Vth of the first embodiment to the threshold voltage Vth(2081) of the PMOS transistor 2081. Specifically, a clamp current flows from the tail connection point P1 to the PMOS transistor 2081 through the resistor 210 and from the PMOS transistor 2081 to the grounding point to allow the voltage difference between the connection point INM and the connection point P6 to be set to the threshold voltage Vth(2081) of the PMOS transistor 2081. Thus, the gate-source voltage Vgs(104) of the PMOS transistor 104 based on the output voltage VOUT is clamped to a level less than that of −Vth(104).

According to the second embodiment, it is possible to clamp the gate-source voltage Vgs(104) of the PMOS transistor 104 to a level less than that of −Vth(104), reduce the difference between the gate-source voltage Vgs(103) of the PMOS transistor 103 and the gate-source voltage Vgs(104) of the PMOS transistor 104, and reduce the imbalance between the respective influences of the NBTI and the PBTI on the PMOS transistors 103 and 104 as compared to that in the first embodiment.

As a result of reducing the imbalance between the respective influences of the NBTI and the PBTI, according to the second embodiment, it is possible to further reduce the difference between the respective amounts of variation in gate-source voltage Vgs(103) applied to the gate of the PMOS transistor 103 and variation in gate-source voltage Vgs(104) applied to the gate of the PMOS transistor 104 as compared to that in the first embodiment, and thus further inhibit an offset in the output voltage VOUT.

Third Embodiment

Figure 7:
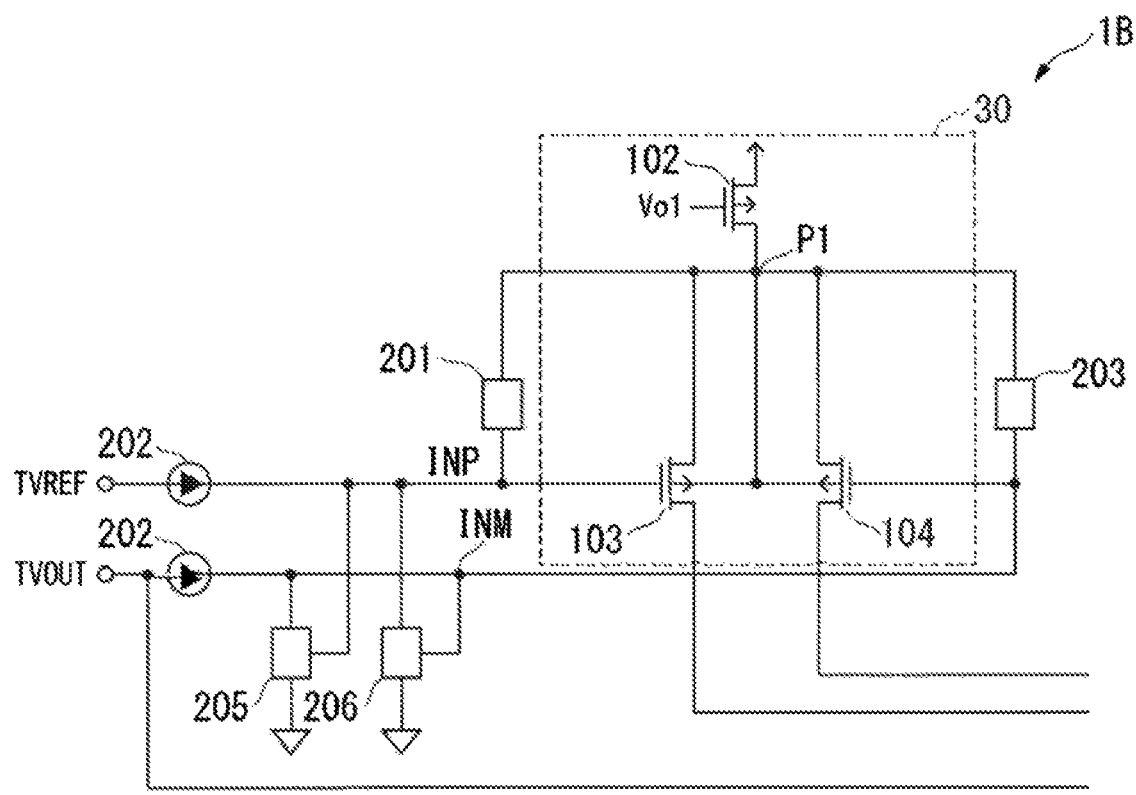
FIG. 7 is a circuit diagram for illustrating a configuration example of a voltage regulator according to a third embodiment of the present invention.

In the following, description is given of a third embodiment of the present invention with reference to the drawings. FIG. 7 is a circuit diagram for illustrating a configuration example of a voltage regulator 1B according to the third embodiment.

The voltage regulator 1B includes the same configuration as that of the voltage regulator 1, and therefore the respective configurations of the current mirror circuit 31, the resistor 32, the NMOS transistor 33, and the PMOS transistor 34 are omitted in FIG. 7. In the following, description is given of a configuration and an operation which are different from those in the first embodiment.

In the third embodiment, the voltage regulator 1B includes, in addition to the GS voltage limiting circuit 201 and the GG voltage limiting circuit 206, an GS voltage limiting circuit 203 serving as a third voltage control circuit and an GG voltage limiting circuit 205 serving as a fourth voltage control circuit.

The GS voltage limiting circuit 203 and the GG voltage limiting circuit 205 are provided to reduce the difference between the respective amounts of variation in gate-source voltage Vgs(103) applied to the gate of the PMOS transistor 103 and variation in gate-source voltage Vgs(104) applied to the gate of the PMOS transistor 104 if the power supply short-circuit is occurred at the output terminal TVOUT.

The GS voltage limiting circuit 203 includes the same configuration as that of the GS voltage limiting circuit 201, and is interposed between the tail connection point P1 and the connection point INM.

Further, the GG voltage limiting circuit 205 includes the same configuration as that of the GG voltage limiting circuit 206, and is interposed between the connection point INM and the grounding point.

If the power supply short-circuit is occurred at the output terminal TVOUT, the GG voltage limiting circuit 205 allows a clamp current to flow from the connection point INM to the grounding point, and clamps the voltage VINM at the connection point INM to VREF+2×Vth.

In addition, the voltage VINM at the connection point INM is higher than the voltage at the tail connection point P1. Consequently, the GS voltage limiting circuit 203 allows a clamp current to flow from the connection point INM to the tail connection point P1, and clamps the voltage at the tail connection point P1 to VREF+2×Vth−Vth.

In the following, description is given of a gate-source voltage Vgs(103) applied to the gate of the PMOS transistor 103 and a gate-source voltage Vgs(104) applied to the gate of the PMOS transistor 104, each based on the reference voltage VREF. Here, the gate-source voltage Vgs(103) is the clamped voltage at the tail connection point P1 and the gate-source voltage Vgs(104) is the clamped voltage at the connection point INM, respectively described above.

Each of the PMOS transistors 103 and 104, the PMOS transistor 2012 in the GS voltage limiting circuit 203, and the PMOS transistors 2062 and 2063 in the GG voltage limiting circuit 205 are formed to have the same threshold voltage. Thus, the threshold voltage thereof is simply represented as Vth.

The gate-source voltage Vgs(103) of the PMOS transistor 103 is obtained by subtracting the voltage at the tail connection point P1 from the voltage VINP at the connection point INP.

Vgs(103)=(VREF)−(VREF+2×Vth−Vth)=−Vth

Similarly, the gate-source voltage Vgs(104) of the PMOS transistor 104 is obtained by subtracting the voltage at the tail connection point P1 from the voltage VINM at the connection point INM.

Vgs(104)=(VREF+2×Vth)−(VREF+2×Vth−Vth)=Vth

According to the above-mentioned calculation, the gate-source voltage Vgs(103) of the PMOS transistor 103 is the voltage −Vth which gives the influence of NBTI to the PMOS transistor 103. Meanwhile, the gate-source voltage Vgs(104) of the PMOS transistor 104 is a voltage Vth which gives the influence of PBTI to the PMOS transistor 104.

However, similarly to the first embodiment in which the output terminal TVOUT is short-circuited by grounding, each absolute value of the gate-source voltage Vgs(103) and the gate-source voltage Vgs(104) is controlled to be equal to or smaller than that of the threshold voltage.

According to the third embodiment, not only if the output terminal TVOUT is short-circuited by grounding, but also if the output terminal TVOUT is short-circuited caused by connecting with the power source, due to the clamping operation of each of the GS voltage limiting circuit 203 and the GG voltage limiting circuit 205, the difference between the gate-source voltage Vgs(103) of the PMOS transistor 103 and the gate-source voltage Vgs(104) of the PMOS transistor 104 resulting from the short-circuiting through connection of the output terminal TVOUT to the power source is reduced as compared to that achieved hitherto.

That is, according to the third embodiment, also if the power supply short-circuit is occurred at the output terminal TVOUT, imbalance between the respective influences given by the NBTI and the PBTI to the PMOS transistors 103 and 104 is significantly reduced, with the result that it is possible to reduce a difference between the respective amounts of variation in gate-source voltage Vgs(103) applied to the gate of the PMOS transistor 103 and variation in gate-source voltage Vgs(104) applied to the gate of the PMOS transistor 104, and thus inhibit an offset in the output voltage VOUT.

Fourth Embodiment

Figure 8:
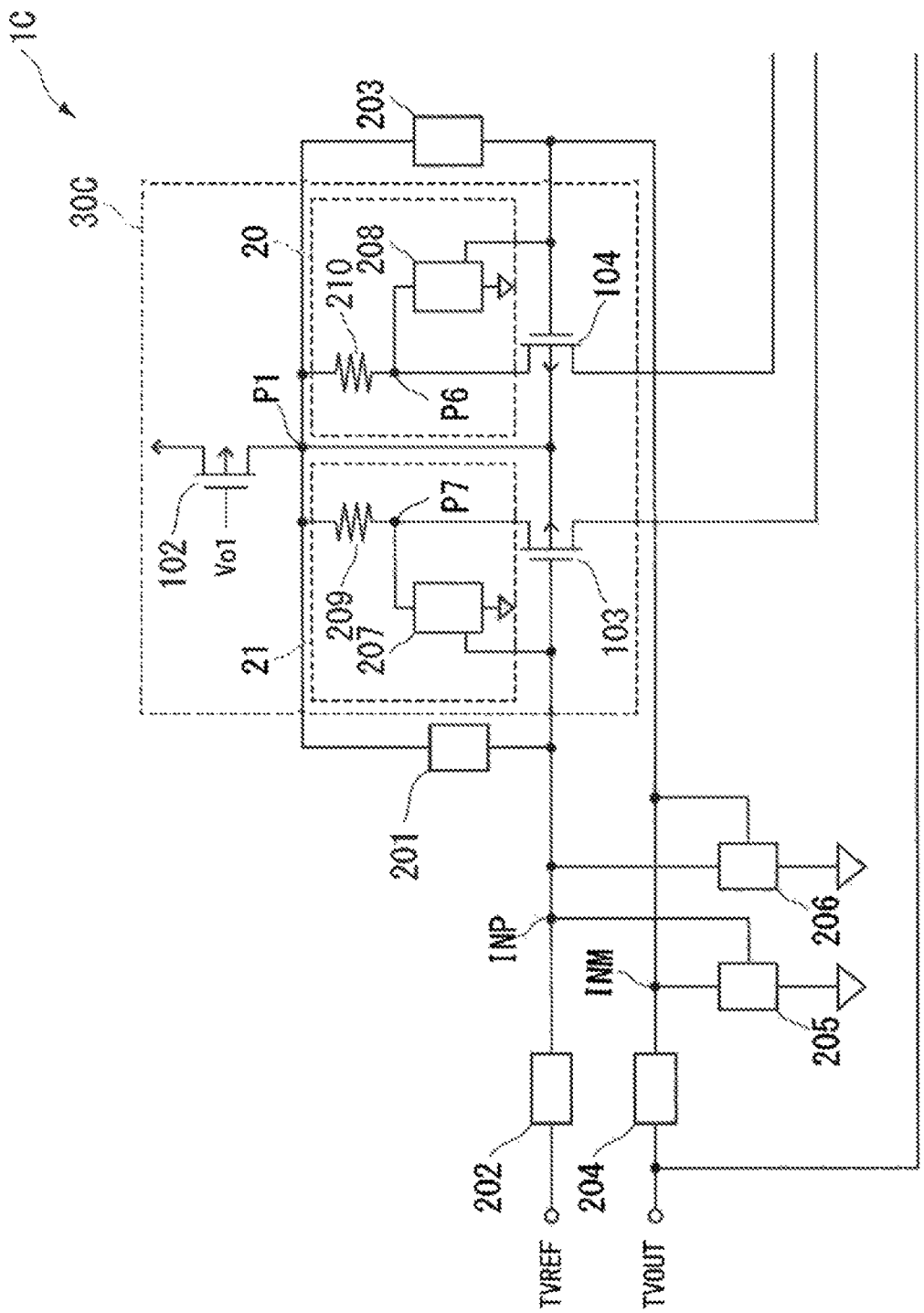
FIG. 8 is a circuit diagram for illustrating a configuration example of a voltage regulator according to a fourth embodiment of the present invention.
Figure 9:
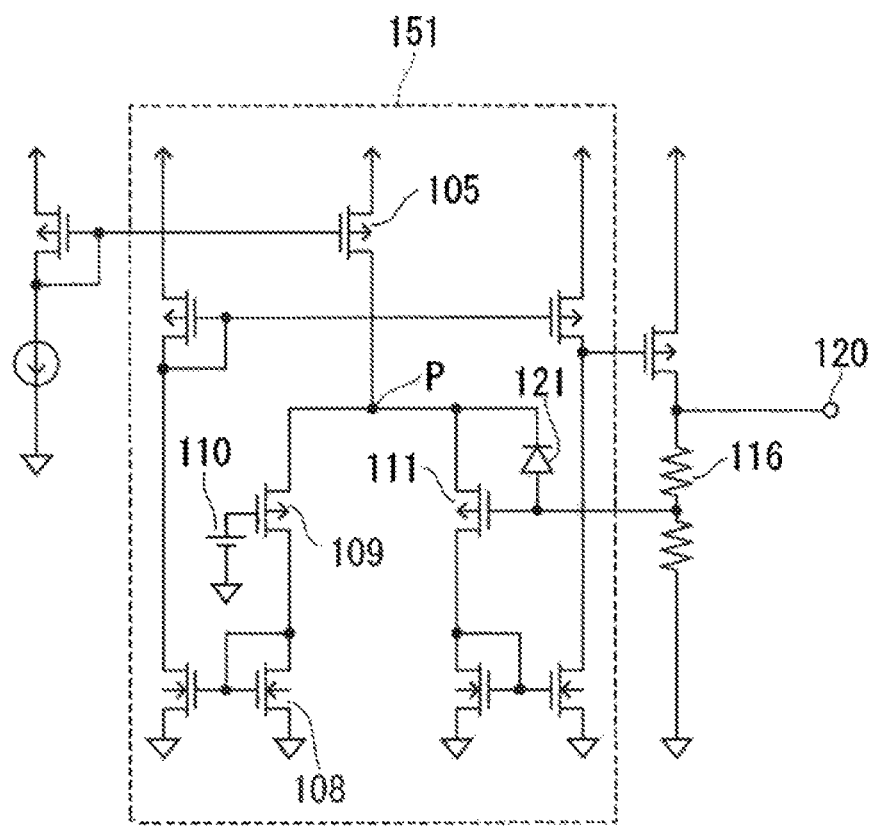
FIG. 9 is a circuit diagram illustrating a configuration example of a conventional voltage regulator.

In the following, description is given of a fourth embodiment of the present invention with reference to the drawings. FIG. 8 is a circuit diagram for illustrating a configuration example of a voltage regulator 1C according to the fourth embodiment.

The voltage regulator 1C as well as the voltage regulator 1B include the same configuration as that of the voltage regulator 1. Thus, similarly to FIG. 7, the respective configurations of the current mirror circuit 31, the resistor 32, the NMOS transistor 33, and the PMOS transistor 34 in FIG. 1 are omitted in FIG. 8. In the following, description is given of a configuration and an operation which are different from those in the third embodiment.

The configuration different from that in the third embodiment is a differential input circuit 30C further including NBTI reduction circuits 20 and 21 in addition to the differential input circuit 30. The NBTI reduction circuit 20 has the same configuration and the same operation as those in the second embodiment, and hence description thereof is omitted in this embodiment.

If the power supply short-circuit is occurred at the output terminal TVOUT, the NBTI reduction circuit 21 sets the absolute value of the gate-source voltage Vgs(103) applied to the gate of the PMOS transistor 103 smaller than that in the third embodiment to reduce the influence of the NBTI on the PMOS transistor 103 as compared to the third embodiment. In other words, if the power supply short-circuit is occurred at the output terminal TVOUT, the difference between the gate-source voltage Vgs(103) of the PMOS transistor 103 and the gate-source voltage Vgs(104) of the PMOS transistor 104 is further reduced.

The NBTI reduction circuit 21 includes a resistor 209 and an GS voltage limiting circuit 207 serving as a fifth voltage control circuit. The GS voltage limiting circuit 207 has a function of controlling the gate-source voltage Vgs(103) of the PMOS transistor 103 to a level less than that of the threshold voltage Vth of the PMOS transistor 103.

The resistor 209 is interposed between the tail connection point P1 and the source of the PMOS transistor 103.

The GS voltage limiting circuit 207 is interposed between a connection point P7 between the resistor 209 and the PMOS transistor 103 and the grounding point.

The GS voltage limiting circuit 207 is the same as, for example, the GS voltage limiting circuit 208 of FIG. 6A, and can reduce the gate-source voltage Vgs(103) of the PMOS transistor 103 from −Vth of the third embodiment to the threshold voltage Vth(2081) of the PMOS transistor 2081. Specifically, clamp current flows from the tail connection point P1 to the PMOS transistor 2081 through the resistor 209 and from the PMOS transistor 2081 to the grounding point to allow the voltage difference between the connection point INP and the connection point P6 to be set to the threshold voltage Vth(2081) of the PMOS transistor 2081. The difference voltage set to the threshold voltage Vth (2081) results in that the gate-source voltage Vgs(103) of the PMOS transistor 103 based on the reference voltage VREF is clamped to a level less than that of −Vth(103).

According to the fourth embodiment, it is possible to clamp the gate-source voltage Vgs(103) of the PMOS transistor 103 to a level less than that of −Vth(103), reduce the difference between the gate-source voltage Vgs(103) of the PMOS transistor 103 and the gate-source voltage Vgs(104) of the PMOS transistor 104, and reduce the imbalance between the respective influences of the NBTI and the PBTI on the PMOS transistors 103 and 104 as compared to that in the first embodiment.

As a result of reducing the imbalance between the respective influences of the NBTI and the PBTI, according to the fourth embodiment, it is possible to further reduce the difference between the respective amounts of variation in gate-source voltage Vgs(103) applied to the gate of the PMOS transistor 103 and variation in gate-source voltage Vgs(104) applied to the gate of the PMOS transistor 104 as compared to that in third embodiment and thus further inhibit an offset in the output voltage VOUT.

Although the embodiments of the present invention have been described in detail with reference to the drawings, the specific configurations are not limited to those of the embodiments, and the present invention also encompasses design modifications and the like without departing from the gist of this invention.

What is claimed is:

1. A voltage regulator which includes a differential amplifier circuit containing a first input transistor and a second input transistor and is configured to control a gate-source voltage in each of the first input transistor and the second input transistor respectively being a PMOS transistor comprising:

a current source containing a current source output port, being configured to drive the differential amplifier circuit;

the first input transistor containing a source connected to the current source output port via a tail connection point and a gate to which a reference voltage is supplied;

the second input transistor containing a source connected to the tail connection point and a gate connected to the output terminal; and a voltage controller including at least one of a first voltage control circuit which is interposed between the tail connection point and the gate of the first input transistor and is configured to control a voltage at the tail connection point based on a voltage at the gate of the first input transistor, a second voltage control circuit which contains a first port connected to the gate of the first input transistor, a second port connected to a grounding point, and a third port connected to the gate of the second input transistor and is configured to control the voltage at the gate of the first input transistor based on a voltage at the gate of the second input transistor, a third voltage control circuit which is interposed between the tail connection point and the gate of the second input transistor and is configured to control the voltage at the tail connection point based on the voltage at the gate of the second input transistor, and a fourth voltage control circuit which contains a first port connected to the gate of the second input transistor, a second port connected to the grounding point, and a third port connected to the gate of the first input transistor and is configured to control the voltage at the gate of the second input transistor based on the voltage at the gate of the first input transistor.

2. The voltage regulator according to claim 1, wherein the voltage controller includes the first voltage control circuit controlling the voltage at the tail connection point if the short-circuit occurs between the output terminal and the ground and the second voltage control circuit controlling the voltage at the tail connection point and the voltage at the gate of the first input transistor if the short-circuit occurs between the output terminal and the ground, and controls to provide a predetermined voltage difference between the gate-source voltage of the first input transistor and the gate-source voltage of the second input transistor.

3. The voltage regulator according to claim 2,
wherein the first voltage control circuit is configured to limit the voltage at the tail connection point, and
wherein the second voltage control circuit is configured to limit the voltage at the gate of the first input transistor.

4. The voltage regulator according to claim 2, further comprising:
a first resistor interposed between the tail connection point and the source of the first input transistor; and
a fifth voltage control circuit interposed between the grounding point and a connection point between the first resistor and the source of the first input transistor,
wherein the fifth voltage control circuit is configured to control the gate-source voltage of the first input transistor to a voltage lower than a threshold voltage of the first input transistor based on the voltage at the gate of the first input transistor.

5. The voltage regulator according to claim 3, further comprising:
a first resistor interposed between the tail connection point and the source of the first input transistor; and
a fifth voltage control circuit interposed between the grounding point and a connection point between the first resistor and the source of the first input transistor;
wherein the fifth voltage control circuit is configured to control the gate-source voltage of the first input transistor to a voltage lower than a threshold voltage of the first input transistor based on the voltage at the gate of the first input transistor.

6. The voltage regulator according to claim 1, wherein the voltage controller includes the third voltage control circuit controlling the voltage at the tail connection point if the short-circuit occurs between the output terminal and the ground and the fourth voltage control circuit controlling the voltage at the tail connection point and the voltage at the gate of the second input transistor if the short-circuit occurs between the output terminal and the ground, and controls to provide a predetermined voltage difference between the gate-source voltage of the first input transistor and the gate-source voltage of the second input transistor.

7. The voltage regulator according to claim 2, wherein the voltage controller includes the third voltage control circuit controlling the voltage at the tail connection point if the short-circuit occurs between the output terminal and the ground and the fourth voltage control circuit controlling the voltage at the tail connection point and the voltage at the gate of the second input transistor if the short-circuit occurs between the output terminal and the ground, and controls to provide a predetermined voltage difference between the gate-source voltage of the first input transistor and the gate-source voltage of the second input transistor.

8. The voltage regulator according to claim 3, wherein the voltage controller includes the third voltage control circuit controlling the voltage at the tail connection point if the short-circuit occurs between the output terminal and the ground and the fourth voltage control circuit controlling the voltage at the tail connection point and the voltage at the gate of the second input transistor if the short-circuit occurs between the output terminal and the ground, and controls to provide a predetermined voltage difference between the gate-source voltage of the first input transistor and the gate-source voltage of the second input transistor.

9. The voltage regulator according to claim 4, wherein the voltage controller includes the third voltage control circuit controlling the voltage at the tail connection point if the short-circuit occurs between the output terminal and the ground and the fourth voltage control circuit controlling the voltage at the tail connection point and the voltage at the gate of the second input transistor if the short-circuit occurs between the output terminal and the ground, and controls to provide a predetermined voltage difference between the gate-source voltage of the first input transistor and the gate-source voltage of the second input transistor.

10. The voltage regulator according to claim 5, wherein the voltage controller includes the third voltage control circuit controlling the voltage at the tail connection point if the short-circuit occurs between the output terminal and the ground and the fourth voltage control circuit controlling the voltage at the tail connection point and the voltage at the gate of the second input transistor if the short-circuit occurs between the output terminal and the ground, and controls to provide a predetermined voltage difference between the gate-source voltage of the first input transistor and the gate-source voltage of the second input transistor.

11. The voltage regulator according to claim 6,
wherein the third voltage control circuit is configured to limit the voltage at the tail connection point, and
wherein the fourth voltage control circuit is configured to limit the voltage at the gate of the second input transistor.

12. The voltage regulator according to claim 7,
wherein the third voltage control circuit is configured to limit the voltage at the tail connection point, and
wherein the fourth voltage control circuit is configured to limit the voltage at the gate of the second input transistor.

13. The voltage regulator according to claim 6, further comprising,:
a second resistor, interposed between the tail connection point and the source of the second input transistor; and
a sixth voltage control circuit interposed between the grounding point and a connection point between the second resistor and the source of the second input transistor,
wherein the sixth voltage control circuit is configured to control the gate-source voltage of the second input transistor to a voltage lower than a threshold voltage of the second input transistor based on the voltage at the gate of the second input transistor.

14. The voltage regulator according to claim 7, further comprising:
a second resistor interposed between the tail connection point and the source of the second input transistor; and
a sixth voltage control circuit interposed between the grounding point and a connection point between the second resistor and the source of the second input transistor,
wherein the sixth voltage control circuit is configured to control the gate-source voltage of the second input transistor to a voltage lower than a threshold voltage of the second input transistor based on the voltage at the gate of the second input transistor.

15. The voltage regulator according to claim 8, further comprising:
a second resistor interposed between the tail connection point and the source of the second input transistor; and
a sixth voltage control circuit interposed between the grounding point and a connection point, between the second resistor and the source of the second input transistor,
wherein the sixth voltage control circuit is configured to control the gate-source voltage of the second input transistor to a voltage lower than a threshold voltage of the second transistor based on the voltage at the gate of the second input transistor.

16. The voltage regulator according to claim 9, further comprising:
a second resistor interposed between the tail connection point and the source of the second transistor; and
a sixth voltage control circuit interposed between the grounding point and a connection point between the second resistor and the source of the second input transistor,
wherein the sixth voltage control circuit configured to control the gate-source voltage of the second input transistor to a voltage lower than a threshold voltage of the second input transistor based on the voltage at the gate of the second input transistor.

17. The voltage regulator according to claim 10, further comprising:
a second resistor interposed between the tail connection point and the source of the second input transistor; and
a sixth voltage control circuit interposed between the grounding point and a connection point between the second resistor and the source of the second input transistor,
wherein the sixth voltage control circuit is configured to control the gate-source voltage of the second input transistor to a voltage lower than a threshold voltage of the second input transistor based on the voltage at the gate of the second input transistor.

18. The voltage regulator according to claim 11, further comprising:
a second resistor interposed between the tail connection point and the source of the second input transistor; and
a sixth voltage control circuit interposed between the grounding point and a connection point between the second resistor and the source of the second input transistor,
wherein the sixth voltage control circuit is configured to control the gate-source voltage of the second input transistor to a voltage lower than a threshold voltage of the second input transistor based on the voltage at the gate of the second input transistor.

19. The voltage regulator according to claim 12, further comprising:
a second resistor interposed between the tail connection point and the source of the second input transistor; and
a sixth voltage control circuit interposed between the grounding point and a connection point between the second resistor and the source of the second input transistor,
wherein the sixth voltage control circuit is configured to control the gate-source voltage of the second input transistor to a voltage lower than a threshold voltage of the second input transistor based on the voltage at the gate of the second input transistor.

20. A method of controlling a voltage regulator which includes a current source configured to drive a differential amplifier circuit, a first input transistor, and a second input transistor, the first input transistor being a PMOS transistor containing a source connected to a current source output terminal of the current source via a tail connection point and containing a gate to which a reference voltage is input, the second input transistor being a PMOS transistor containing a source connected to the tail connection point and containing a gate connected to an output terminal, the voltage regulator being configured to control, if a short circuit occurs between the output terminal configured to output a predetermined output voltage and a ground, a gate-source voltage of each of the first input transistor and the second input transistor in the differential amplifier circuit configured to control the predetermined output voltage the method comprising:

preparing a voltage controller including at least one of a first voltage control circuit which is interposed between the tail connection point and the gate of the first input transistor and is configured to control a voltage at the tail connection point based on a voltage at the gate of the first input transistor, a second voltage control circuit which contains a first port connected to the gate of the first input transistor, a second port connected to a grounding point, and a third port connected to the gate of the second input transistor and is configured to control the voltage at the gate of the first input transistor based on a voltage at the gate of the second input transistor, a third voltage control circuit which is interposed between the tail connection point and the gate of the second input transistor and is configured to control the voltage at the tail connection point based on the voltage at the gate of the second input transistor, and a fourth voltage control circuit which contains a first port connected to the gate of the second input transistor, a second port connected to the grounding point, and a third port connected to the gate of the first input transistor and is configured to control the voltage at the gate of the second input transistor based on the voltage at the gate of the first input transistor; and performing a voltage control by the voltage controller, the voltage control including at least one of controlling a voltage at the tail connection point based on a voltage at the gate of the first input transistor, controlling the voltage at the gate of the first input transistor based on a voltage at the gate of the second input transistor, controlling the voltage at the tail connection point based on the voltage at the gate of the second input transistor, and controlling the voltage at the gate of the second input transistor based on a voltage at the gate of the second input transistor.

* * * * *

UNITED STATES PATENT AND TRADEMARK OFFICE
CERTIFICATE OF CORRECTION

PATENT NO. : 10,591,942 B2
APPLICATION NO. : 16/506733
DATED : March 17, 2020
INVENTOR(S) : Tadakatsu Kuroda et al.

Page 1 of 1

It is certified that error appears in the above-identified patent and that said Letters Patent is hereby corrected as shown below:

In the Claims

In Column 15, Claim 15, Line 14, insert -- input -- between "second" and "transistor".

In Column 15, Claim 16, Line 19, insert -- input -- between "second" and "transistor".

In Column 15, Claim 16, Line 24, insert -- is -- between "circuit" and "configured".

Signed and Sealed this
Nineteenth Day of May, 2020

Andrei Iancu
*Director of the United States Patent and Trademark Office*